(12) United States Patent
Celani

(10) Patent No.: US 7,583,113 B2
(45) Date of Patent: Sep. 1, 2009

(54) SAWTOOTH OSCILLATOR HAVING CONTROLLED ENDPOINTS AND METHODOLOGY THEREFOR

(75) Inventor: Jonathan W. Celani, Hudson, NH (US)

(73) Assignee: Linear Technology Corporation, Milpitas, CA (US)

( * ) Notice: Subject to any disclaimer, the term of this patent is extended or adjusted under 35 U.S.C. 154(b) by 206 days.

(21) Appl. No.: 11/607,899

(22) Filed: Dec. 4, 2006

(65) Prior Publication Data

US 2008/0129400 A1    Jun. 5, 2008

(51) Int. Cl.
*H03K 4/06* (2006.01)
(52) U.S. Cl. ...................... 327/140; 327/131
(58) Field of Classification Search ......... 327/131–137, 327/140, 101
See application file for complete search history.

(56) References Cited

U.S. PATENT DOCUMENTS

| | | | |
|---|---|---|---|
| 5,502,410 A * | 3/1996 | Dunn et al. .................. | 327/140 |
| 6,163,190 A * | 12/2000 | Takai et al. .................. | 327/205 |
| 6,384,645 B2 * | 5/2002 | Brambilla et al. ............ | 327/137 |
| 6,600,349 B2 * | 7/2003 | Tam ............................. | 327/131 |
| 6,930,520 B2 * | 8/2005 | Solie ............................ | 327/131 |
| 7,355,461 B2 * | 4/2008 | Nagashima et al. .......... | 327/134 |
| 7,403,049 B2 * | 7/2008 | Uchimoto et al. ............ | 327/131 |

* cited by examiner

*Primary Examiner*—Lincoln Donovan
*Assistant Examiner*—Hai L Nguyen
(74) *Attorney, Agent, or Firm*—McDermott Will & Emery LLP

(57) ABSTRACT

A controlled endpoint sawtooth waveform generator and methodology is implemented by a circuit that uses charge sharing between capacitors to produce a sawtooth having one or both endpoints that are suspended between the power supply rail and ground. The circuit may comprise a timing capacitor to which a charging source is coupled, and a switched capacitor coupled to the timing capacitor through a first controlled switch and to a source of switched capacitor reference voltage through a second controlled switch. The first and second controlled switches are responsive to a control signal, that may be internally or externally provided, for mutually exclusive switch operation. An output sawtooth thereby is produced having one endpoint determined by a fixed voltage source and the other endpoint in accord with the capacitance ratio of the timing and switched capacitors.

23 Claims, 6 Drawing Sheets

US 7,583,113 B2

SAWTOOTH OSCILLATOR HAVING CONTROLLED ENDPOINTS AND METHODOLOGY THEREFOR

FIELD OF THE INVENTION

The subject matter herein relates generally to oscillators, and more particularly to oscillators such as sawtooth generators configured to produce accurate, high speed sawtooth signals having controlled endpoints.

BACKGROUND

Oscillator circuits that have rapid charge/discharge characteristics are a vital part of many system architectures. A sawtooth waveform oscillator is used as a reference signal in the control loops of typical PWM-based power conversion systems, for example. Voltage mode switching DC/DC converter architectures often use this type of waveform to compare against an output voltage error signal, the result of which ultimately determines switch duty-cycle. Most current mode architectures require a sawtooth waveform to use as the basis for generation of a slope compensation signal.

Several oscillator methods are used to generate a non-symmetric waveform such as a sawtooth, but most share a common theme of slowly charging a timing capacitor, then quickly shunting the acquired charge through a low-impedance path. This can, of course, also be done in reverse, by quickly charging the timing capacitor then and slowly discharging it. Such method can be applied both for fast-charge and fast-discharge architectures.

The technique of quickly shunting acquired charge through a low-impedance path is generally adequate when the associated reference of the output waveform is ground, since a simple switched shunt can be employed, as used in sawtooth generator 100 in FIG. 1A. A capacitor C1 is charged by a current source I to produce a gradual rise in capacitor voltage, shown in FIG. 1B. When the voltage on capacitor C1 attains a level indicated by $V_{REF}$, as determined by comparator COMP, the capacitor is discharged by switch S1 during a time delay td corresponding to the fall time of the waveform. This simple architecture is implemented when the endpoints of the sawtooth waveform are at reference and ground levels, i.e., at $V_{REF}$ and GND, shown in FIG. 1B.

When generation of a similar waveform that has both endpoints suspended between the power supply and ground is desired, however, control of the lower endpoint is not trivial. Finite control propagation delays generally prevent the use of comparative hysteretic techniques for control of the endpoints of a rapidly changing voltage, and undershoot can create large errors in the downslope endpoint, resulting in significant errors in oscillator frequency. Low-impedance clamps commonly are used to eliminate undershoot error at the end of the capacitor discharge period to shunt discharge currents away from the timing capacitor once the lower-reference has been reached, as shown in the example of sawtooth generator 200, FIG. 2A. In the circuit illustrated, the charge applied to capacitor C1 is clamped to ~$V_{REF2}$. In order to keep these shunt currents to reasonable levels, however, oscillators that employ lower-reference clamps require increased impedance R1 in the capacitor discharge path through switch S1, and thus have longer discharge times than a ground-referred circuit can produce. Even with reduced discharge currents, these clamp circuits often result in substantial glitching on the associated power supply rail due to transient loading by the shunted discharge current.

SUMMARY

A controlled endpoint sawtooth signal generator circuit, in accord with the teachings herein, comprises first and second charge sharing charge storage devices, and a source of charging current. The generator circuit is configured to operate in a first circuit state in which the first charge storage device is charged by the source of charging current and in which the first and second charge storage devices are mutually isolated, and, in a second circuit state in which the first and second charge storage devices are interconnected for charge sharing.

One embodiment comprises a first charge storage device having an output node to which a charging source is coupled, and a second charge storage device coupled to the first charge storage device through a first controlled switch and to a first source of reference voltage through a second controlled switch. The first and second controlled switches are responsive to a control signal for mutually exclusive operation thereof.

The control signal may be an externally provided trigger signal. Alternatively, the control signal may be produced internally by a circuit such as a comparator having a first input coupled to the first charge storage device, and a second input coupled to a second reference voltage source, and an output, wherein the output of the comparator is coupled to inputs of the first and second controlled switches.

A method for generating an oscillating signal, in accord with another aspect of the teachings herein, is carried out by applying charge to a first capacitor, sharing charge accumulated in the first capacitor with a second capacitor in response to a signal, and successively repeating the preceding steps.

These, as well as other components, steps, features, objects, benefits, and advantages, will now become clear from a review of the following detailed description of illustrative embodiments, the accompanying drawings, and the claims.

DETAILED DESCRIPTION

In accord with the principles taught herein is provided a sawtooth waveform signal generator in which one or both of the endpoints of the sawtooth are suspended between the power supply rail and ground. A single source of reference voltage defines one end point of the sawtooth, and a novel switched capacitor pair charge sharing architecture establishes the other end point, the level of which may be related to capacitor ratio. The generator may be synchronized to oscillate by an internally or externally produced trigger.

Figure 1A:
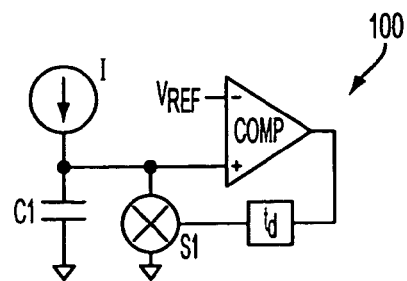
FIG. 1A is a simplified circuit diagram showing a conventional ground referenced sawtooth waveform generator.
Figure 1B:
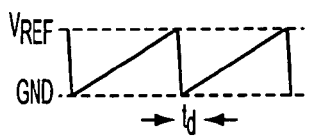
FIG. 1B shows a waveform generated thereby.
Figure 2A:
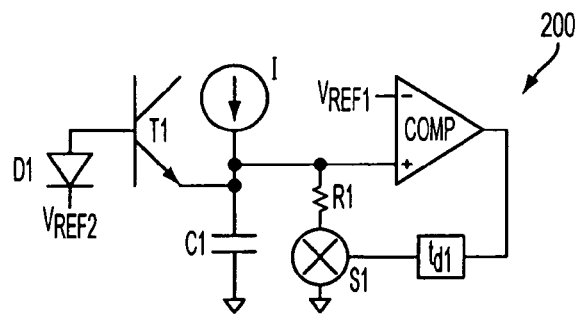
FIG. 2A is a simplified circuit diagram showing a conventional suspended endpoint sawtooth waveform generator.
Figure 2B:
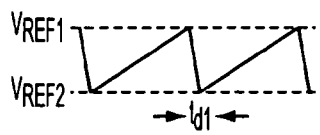
FIG. 2B shows a waveform generated thereby.
Figure 3A:
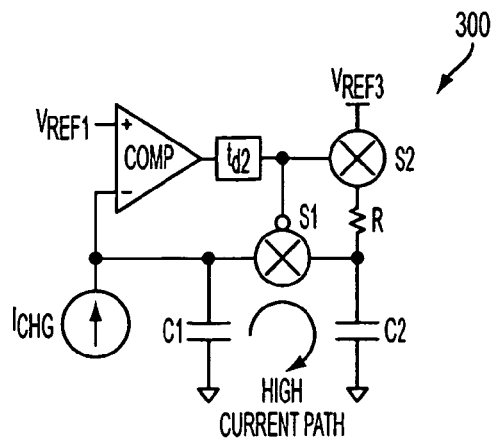
FIG. 3A shows a first embodiment, in which a novel controlled endpoint sawtooth waveform generator is triggered by an internally produced pulse to produce a fast discharge charge sharing oscillator per the teachings herein.

Referring to FIG. 3A, one embodiment of oscillator 300, implementing charge sharing per the teachings herein, comprises a first charge storage device in the form of a timing capacitor C1 and a second charge storage device in the form of a switched capacitor C2, interconnected by a low resistance controlled switch S1. A source of charging current $I_{CHG}$ is connected to the storage node of timing capacitor C1 and to the negative input of a comparator COMP. A source of reference voltage $V_{REF3}$ is connected to the storage node of switched capacitor C2 through a resistive controlled switch S2 (the resistance of the switch is designated by R). Switches S1 and S1 are controlled to be mutually complementary.

A source of reference voltage $V_{REF1}$ is applied to the positive input of comparator COMP, the output of which is applied to the complementary control inputs of switches S1 and S2. A time delay element $t_{d2}$ in the signal flow path between the comparator COMP and controlled switches S1, S2 may be inherent to the comparator, or may be an external component.

Assume the circuit to be operating in steady state, at time $t_1$ (see FIG. 3b), as a result of previous cycles of operation of the oscillator 300, the voltage on timing capacitor C1 has been charged initially to a floating reference level $V_{REF2}$, as will be explained. Assume also that $V_{REF2}$ is lower in magnitude than $V_{REF1}$. At $t_1$, the output of comparator COMP is high since capacitor C1 voltage is initially less than $V_{REF1}$. Switch S2 accordingly is controlled to be on and switch S1 off. Capacitor C2 is charged to switched capacitor reference voltage $V_{REF3}$.

Figure 3B:
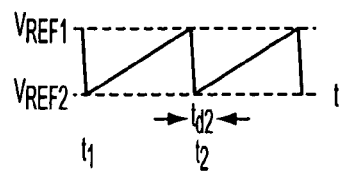
FIG. 3B shows the sawtooth waveform generated thereby.

As capacitor C1 charges by current flow from $I_{CHG}$, voltage on the capacitor rises slowly, forming the upslope portion of the sawtooth waveform shown in FIG. 3b. When the voltage on C1 reaches $V_{REF1}$, the output of comparator COMP becomes low, causing the states of switches S1 and S2 to reverse. Switch S1 is now closed and switch S2 open, to establish the ramp down portion of the sawtooth. With S1 closed, capacitors C1, C2 are connected in parallel, rapidly sharing charge. Since the timing capacitor C1 initially is charged to a voltage greater than that of switched capacitor C2, capacitor C1 discharges into C2, as shown by the arrow in FIG. 3a, until the voltages on both capacitors are equalized at $V_{REF2}$. $V_{REF2}$ is a floating voltage of a magnitude which is a function of the two capacitor voltages prior to discharge and the ratio of the two capacitances. Switches S1, S2 remain in the discharge position for the duration of the propagation delay $t_{d2}$, after which another charge accumulation cycle begins.

During the charge-sharing interval when the voltages on the capacitors C1, C2 are equalizing, a high level of current circulates between the two capacitors so that high-current effects are isolated from the supply rail, allowing extremely short charge-sharing intervals.

The foregoing can be explained quantitatively by the following. At the instant before capacitors C1, C2 are shorted together, $$Q_{(C1)}=C1*V_{REF1} \text{ and}$$

$$Q_{(C2)}=C2*V_{REF3}.$$

When the capacitors are shorted together, charge equalizes on C1 and C2, such that $$Q=Q_{(C1)}+Q_{(C2)}.$$

Since $Q=V_{REF2}*(C1+C2)$, it follows that:

$$V_{REF2}=Q_{(C1)}+Q_{(C2)}/(C1+C2), \text{ or}$$

$$V_{REF2}=(C1*V_{REF1})+(C2*V_{REF3})/(C1+C2).$$

Thus, the circuit of FIG. 3a produces a slow charge sawtooth waveform, in which endpoints of the sawtooth are at $V_{REF1}$ and $V_{REF2}$, and in which only one endpoint at $V_{REF1}$ is established by a reference voltage source, the other endpoint being established internally by charge sharing between capacitors C1, C2.

Figure 4A:
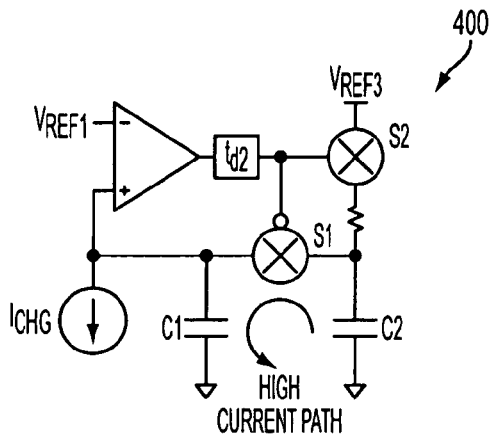
FIGS. 4A and 4B describe a slow discharge charge sharing oscillator and sawtooth waveform using a modification of the foregoing architecture.
Figure 4B:
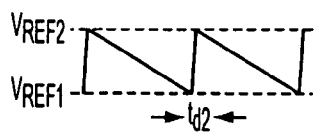

FIG. 4A shows a complementary implementation in which a fast charge, charge-sharing oscillator 400 is produced. This implementation is identical to that of FIG. 3a, except that the polarity of $I_{CHG}$ and the polarity of comparator COMP are reversed compared to the FIG. 3a implementation. Switches S1 and S2 initially are off and on, respectively. Switched capacitor C2 is charged through S2 to the switched capacitor reference $V_{REF3}$. Timing capacitor C1 is discharged as current is sourced into Ichg, and the voltage across C1 drops toward $V_{REF1}$. Capacitor C2 is charged to $V_{REF3}$ during this interval through S2. As capacitor C1 voltage reaches $V_{REF1}$, comparator COMP reverses the states of switches S1, S2 to on and off states, respectively, initiating a charge-sharing event, at which time the voltage on C1 quickly jumps to $V_{REF2}$. As in the previous case, $V_{REF2}$ follows the relation:

$$V_{REF2}=(C1*V_{REF1})+(C2*V_{REF3})/(C1+C2).$$

Figure 5:
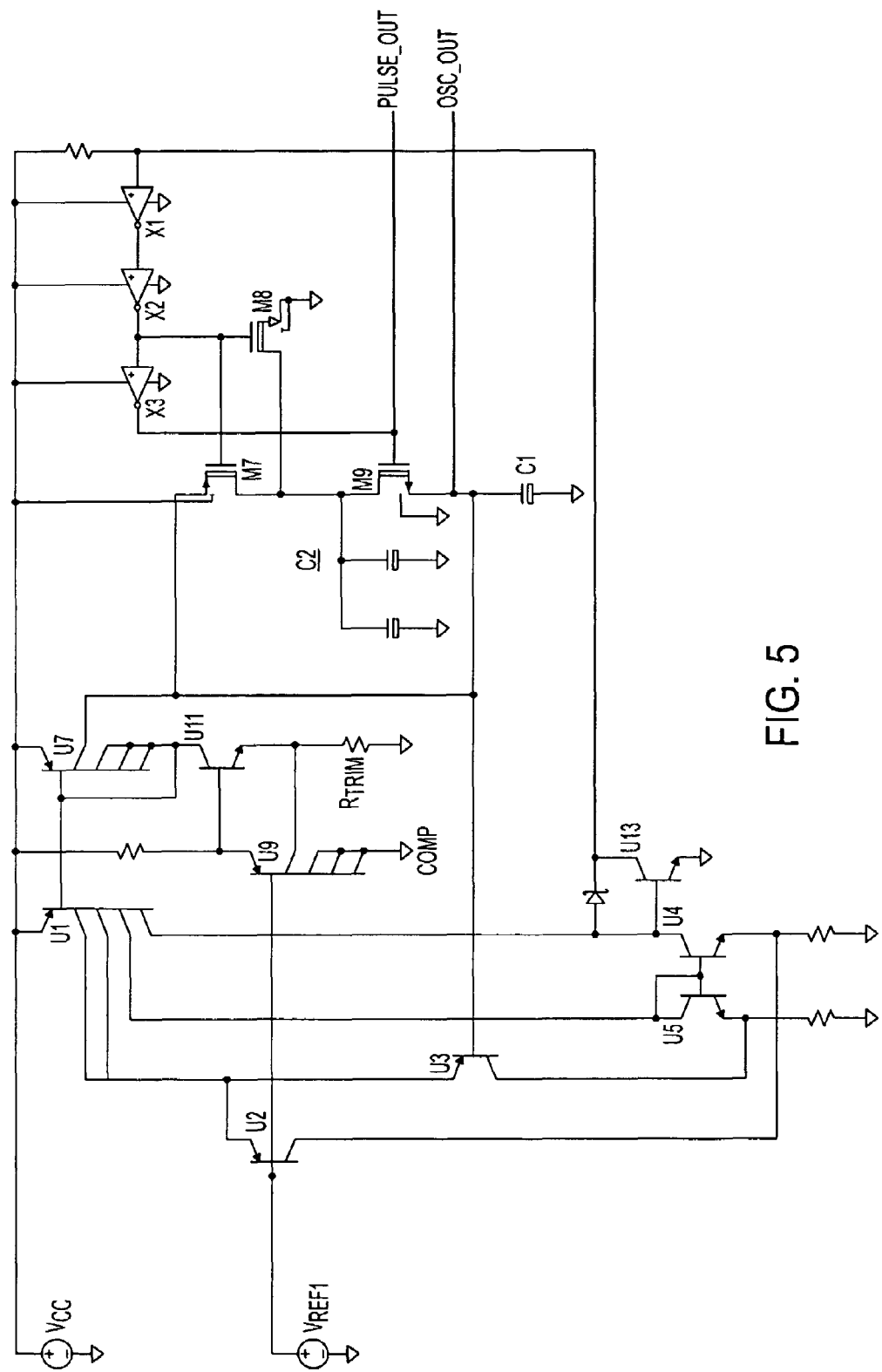
FIG. 5 is a more detailed circuit diagram of FIG. 3A.

FIG. 5 is a circuit diagram of an oscillator that implements the foregoing. This circuit generates a slow-charge, fast-discharge sawtooth output, as well as a synchronized pulsed output that corresponds to the fast-discharge interval. In this circuit, by way of example, $V_{REF1}=1.25V$, and the switched capacitor reference ($V_{REF3}$) is ground. From the equation for $V_{REF2}$ presented above, it follows that if $V_{REF3}$ is 0V, the calculation for $V_{REF2}$ reduces to $$V_{REF2}=(C1*V_{REF1})/(C1+C2).$$

In this circuit, C2=2*C1, so $$V_{REF2}=\frac{1}{3}*V_{REF1}.$$

$V_{REF1}$ is imposed across $R_{TRIM1}$ through transistors U9 and U11 to generate a reference current through transistor U11. This current is mirrored by multiple collector transistors U1 and U7. Transistor U1 provides general circuit bias, and transistor U7 provides the timing capacitor charge current $I_{CHG}$. Transistor U9 provides temperature compensation for $I_{CHG}$, to cause oscillator output frequency to be temperature invariant.

The oscillator control comparator COMP in FIG. 5 comprises transistors U2-U5, and U13. This comparator trips when the voltage on timing capacitor C1 exceeds $V_{REF1}$, or 1.25V, initiating the charge-sharing interval. The capacitor control switches are driven by an inverter/buffer string, X1-X3, connected to the output of the comparator.

During the charge interval, transistor U7 sources $I_{CHG}$ onto timing capacitor C1. During this same interval, the voltage across switched capacitor C2 is held at 0V, by the ground-referred small switch transistor M8. Transistor M8 is sized such that a full discharge of capacitor C2 is assured during the charge interval, while minimizing C2 discharge current. Once the control comparator COMP trips, transistor M8 is disabled and charge-sharing commences between capacitors C1 and C2 through a low-impedance transfer gate comprised of transistors M7 and M9.

When transistors M7 and M9 are enabled, the voltage on timing capacitor C1 falls to $V_{REF2}$ almost immediately. As such, the charge-sharing switches remain active only during the turn-off propagation delay of the comparator.

It is also noted that these finite propagation delays in the oscillator control circuit create an overshoot error in the output waveform, such that the output in the illustrated circuit exceeds $V_{REF1}$ by approximately 75 mV, or 1.325V. This is expected and is a consequence of operating the oscillator at the relatively high frequency of 1 MHz. This overshoot error can be minimized if desired by increasing the speed of the comparator.

When the charge-sharing switches are enabled, the voltage on C1 is reduced by approximately ⅔, as derived above, to 0.45V. When the charge-sharing switches are enabled, transistor M8 shunts the charge on capacitor C2 to ground, and the voltage on capacitor C1 begins to climb again as it accumulates charge due to $I_{CHG}$, initiating another oscillator cycle.

The foregoing examples implement internal triggering by a comparator COMP to synchronize generation of the sawtooth waveform, as described. Another embodiment, described below, is triggered by an externally produced timing signal.

Figure 6A:
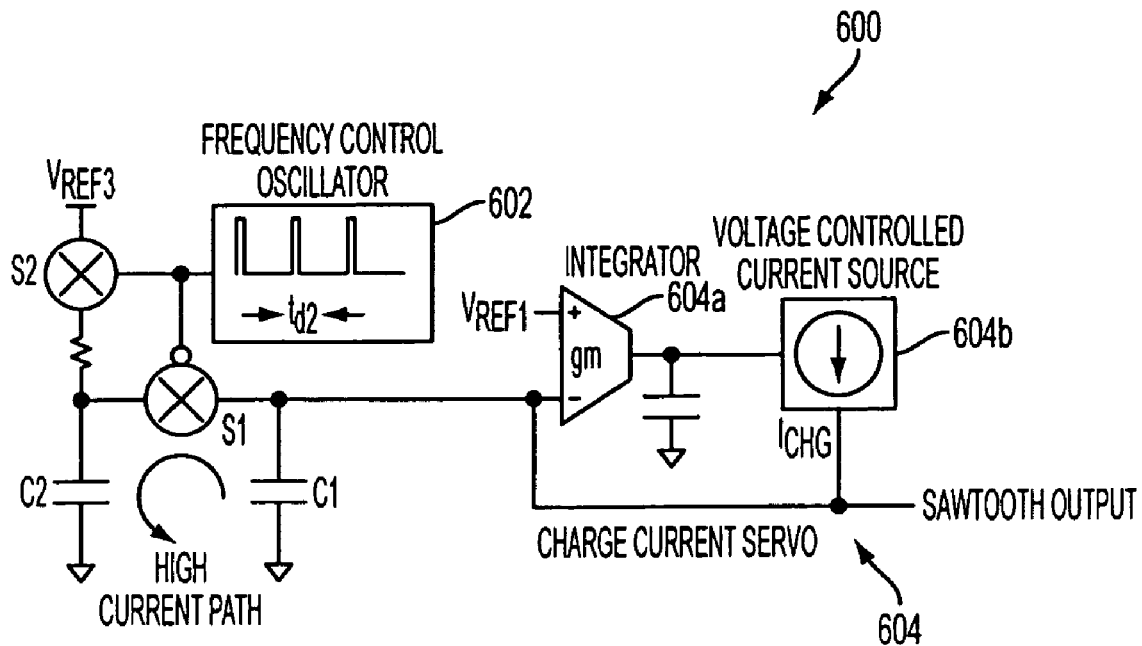
FIG. 6A is a circuit diagram of a second embodiment in which the generator is fast discharging, triggered by an external signal.

Referring to FIG. 6A, oscillator 600 switches S1 and S2 are controlled by a source of synchronization pulses which may be produced from within the oscillator circuit or from an external source of timing pulses to which the sawtooth is to be synchronized. The synchronization pulses, which may be produced by a frequency control oscillator 602 as depicted, have a repetition rate corresponding to the frequency of the sawtooth and a width corresponding to the charge-sharing interval. The pulses are applied to the complimentary control inputs of switches S1 and S2 which function in a manner similar to that of the previous embodiment (FIG. 3A), in which the oscillator is synchronized internally by comparator COMP. Herein, sharing of charge between capacitors C1 and C2 produces an output signal of magnitude that depends on the magnitude of $V_{REF3}$ and the capacitance ratio of capacitors C1 and C2, applied to a charge current servo 604 implemented to track the average value of the sawtooth. Charge current servo 604 comprises an integrator formed by transconductance comparator 604a receiving the sawtooth output and fixed reference $V_{REF1}$, and in response, outputting the sawtooth to an integrating capacitor C3 and to a controlled current source 604b. The servo 604 translates the baseline of the sawtooth to $V_{REF1}$. The high and low endpoints of the sawtooth per FIG. 6A establishing the magnitude of the sawtooth are related by capacitor charge sharing based on the ratio between the two capacitors C1, C2, as in the previous embodiment, but with baseline, or waveform average value, determined by the fixed reference $V_{REF1}$ as shown in FIG. 6A.

Figure 7A:
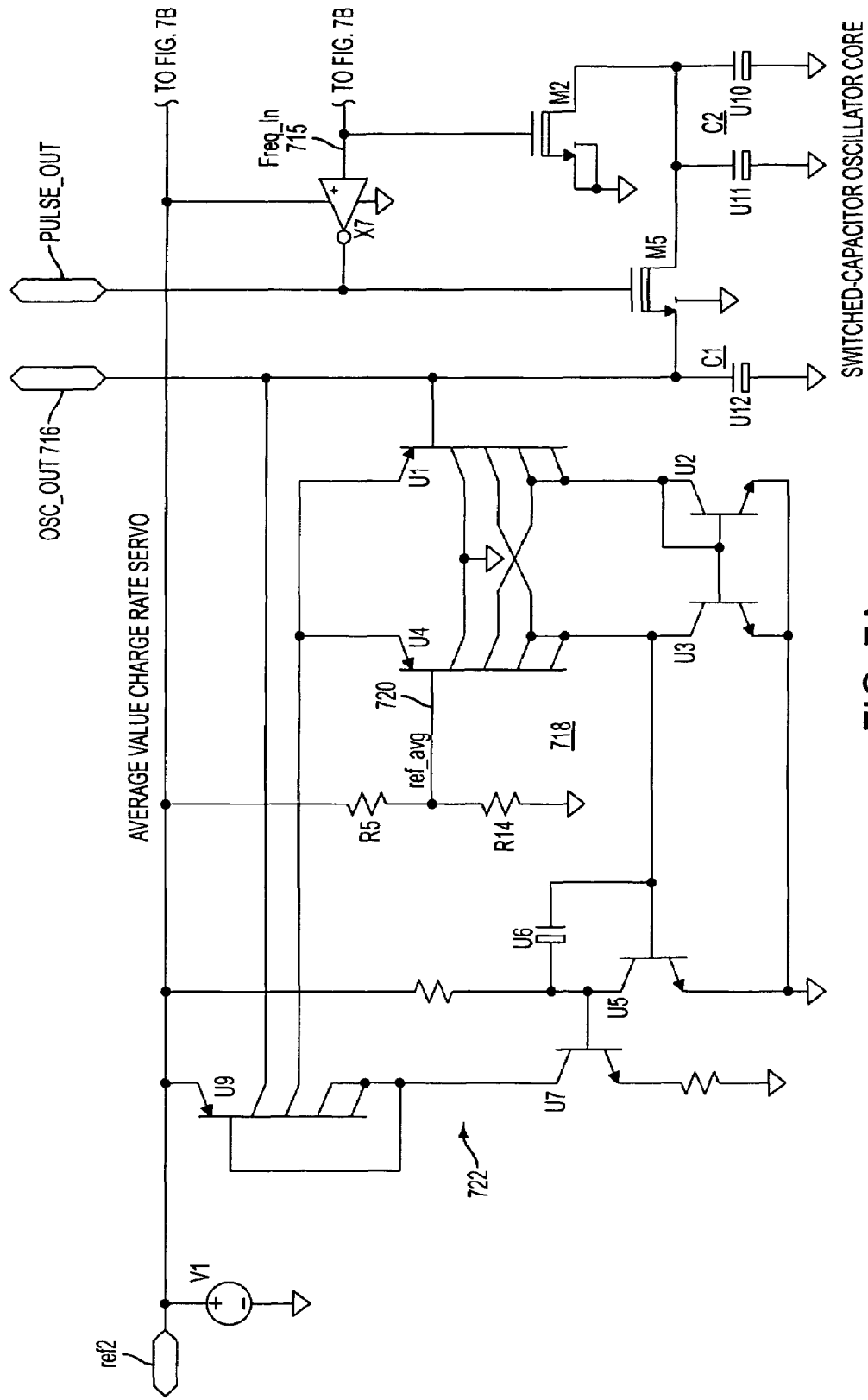
FIGS. 7A, 7B are a more detailed circuit diagram of FIG. 6A.
Figure 7B:
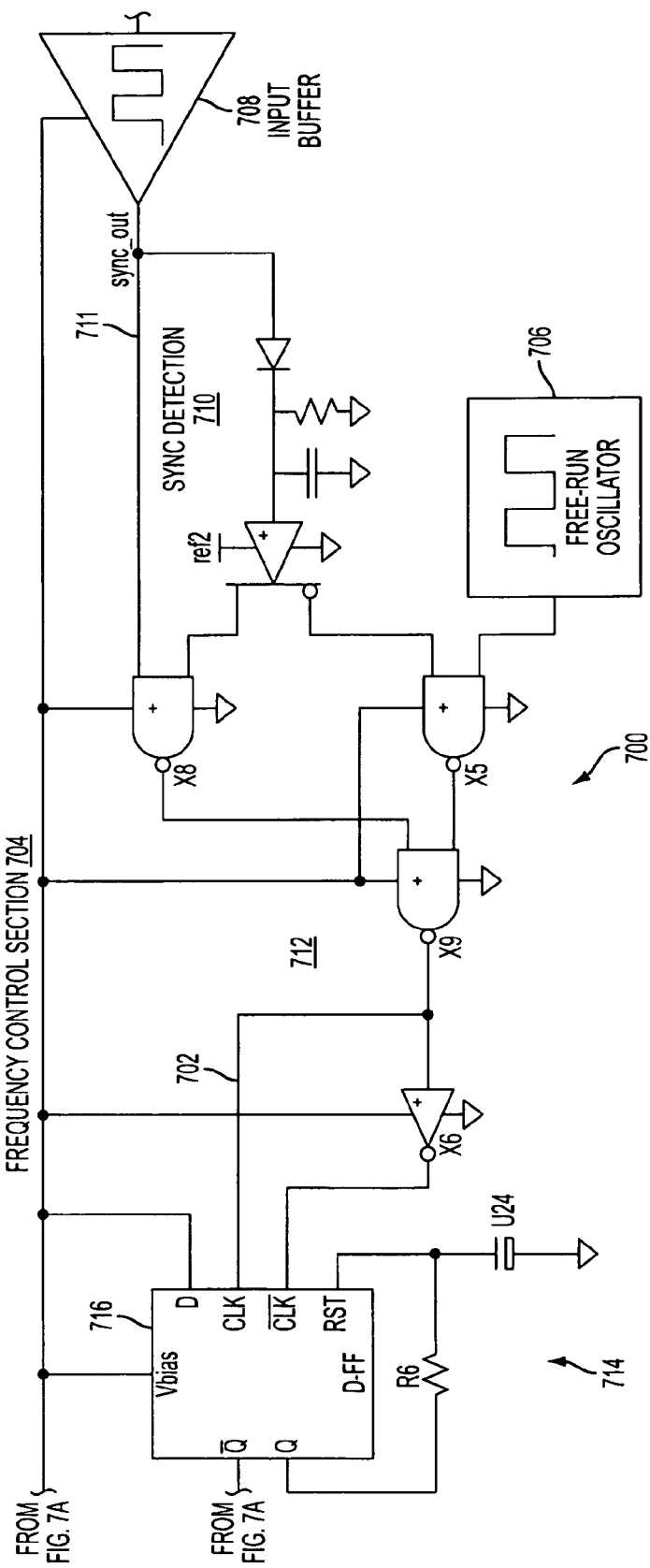

FIGS. 7A, 7B are a diagram of an illustrated circuit for implementing the architecture of FIG. 6A. This circuit generates a controlled amplitude slow-charge, fast-discharge sawtooth output. The oscillation frequency of which is controlled by a digital pulse train at 'control pulse' node 702, which is generated by a frequency control section 704. The frequency control section 704 is composed of a free-run reference oscillator 706, a synchronization pulse input buffer 708, a sync detection circuit 710, control logic 712 and a one-shot 714, interconnected as shown. A D flip-flop 716 is used to implement the one-shot function, and yields (in this example) a 50 ns pulse when a pulse of longer-duration is applied at its complementary clock inputs (CLK and /CLK). The D flip-flop one-shot requires a clock signal that has pulse widths of adequate duration such that they exceed the programmed one-shot time, or 50 ns in the example. This requirement thus applies to both the output of the free-run reference oscillator 706 and any synchronization signal that is applied at SYNC node 711.

The free-run oscillator 716 is one that outputs a logic-level digital pulse-train at ~1 MHz and 50% duty-cycle. The synchronization pulse input buffer 708 converts any digital signal on the SYNC node 711 to a logic-level signal with the same frequency and duty-cycle. If there is no signal at the SYNC input, 'control pulse' node 702 follows the output of the free-run reference oscillator 706. If a synchronization pulse is imposed on the SYNC input, the sync detection circuit 710 reconfigures control logic 712 such that 'control pulse' node 702 follows the output of the synchronization pulse input buffer, or the 'sync out' node. This signal is then imposed onto the clock inputs of one-shot 714. The final output of one-shot 714, and thus of the frequency control section 704, is a series of 50 ns pulses that coincide with the rising edge of the signal on 'control pulse' node 702. The complement of this pulse train appears on 'freq in' node 715.

While 'freq in' is logic high, the switched capacitor C2, comprised of capacitive elements U10 and U11, is discharged to ground through the small switch transistor M2. Timing capacitor C1, implemented by capacitive element U12, is charged by the current sourced by one of the collectors in the multi-collector PNP, U9. The voltage on the timing capacitor C1 (U12) climbs until a 50 ns pulse is output from the frequency control section. When this pulse is generated, 'freq in' is pulled to logic low, which disables transistor M2, and the timing and switched capacitors charge-share through a low-impedance switch transistor M5. At the instant before the switch transistors initiate a charge-sharing event, timing capacitor C1 has achieved a maximum voltage of V1. As the switched capacitor C2 (U10+U11) is twice the value of the timing capacitor, and is referenced to ground through M2, the voltage across timing capacitor C1 is immediately reduced to ⅓ of the value achieved at the end of charging interval. This lower voltage, V2, is related to V1 by the capacitor ratio such that:

$$V2=V1*U12/(U12+U10+U11)$$

In this case, U10=U11=U12, so V2=(⅓)*V1

It is also of note that the average value ($V_{AVG}$) of this sawtooth is:

$$V_{AVG}=(V1+V2)/2,$$

In this case, V2=(⅓)*V1, so $V_{AVG}$=(⅔)*V1,

At the end of the 50 ns frequency control pulse, transistor M5 is disabled, and transistor M2 is enabled, re-initiating another charging interval. The resultant voltage across the timing capacitor U12 thus becomes slow-charge, fast discharge sawtooth, output at 'osc out' node 716. The 'osc out' sawtooth oscillation rate directly follows the frequency control section. This output is also accompanied with a pulse train output at the 'pulse out' node, each pulse representing a 50 ns discharge interval.

Figure 6B:
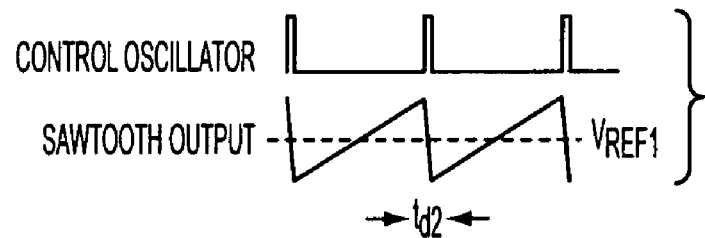
FIG. 6B shows a sawtooth waveform generated thereby.

The sawtooth waveform produced at 'osc out' node 716 is imposed onto an integration amplifier 718, comprised of transistors U1-U5, which forms an error signal related to the difference in the average-value of the sawtooth waveform and a reference voltage. This reference, which corresponds to $V_{REF1}$ in FIG. 6B, is formed by dividing the 2.7V supply rail voltage using resistors R5 and R14 to 0.9V, and is input to the non-inverting input of the integrating amplifier 718 at 'ref avg' node 720. The output of amplifier 718, or collector of U5, drives a voltage-to-current converter 722, comprised of transistors U7 and U9. The multi-collector PNP transistor, U9, provides charging current to timing capacitor U12. These elements act to servo the timing capacitor U12 charging currents such that the average value of the sawtooth waveform is 0.9V. For example, if the average value of the sawtooth is lower than 0.9V, the output of the amplifier 718, or collector of U5, will rise. This, in turn, increases the voltage across R2 via the emitter-follower U7, and in turn the current in U7 will increase. This current is mirrored by U9, increasing the charging current onto the timing capacitor U12, increasing the charging rate. As the charge interval is fixed by the frequency control pulse, the voltage achieved during that charging interval (V1) will also increase. A steady-state is achieved when the average value of the sawtooth output at 'osc out' is equivalent to the voltage at 'ref avg', or 0.9V. Substituting the above relations yields the peak-to-peak voltages of the output sawtooth at 'osc out':

$V_{REF1}=(2/3)*V1$, and $V_{REF1}=0.9V$, so $V1=1.35V$. $V2=(1/3)*V1$, so $V2=0.45V$.

The embodiments described herein provide an oscillator circuit, particularly useful for generating a sawtooth signal having endpoints that are controlled to specific values, doing so by a novel capacitor charge sharing methodology in which a capacitor is charged for the upslope, and charge sharing with another capacitor for the downslope. Both endpoints thereby are controlled, using as few as one fixed voltage reference, having both endpoints related by capacitor ratios. Advantageously, high discharge currents are isolated with respect to the capacitors, and thus do not corrupt the supply rail or ground reference.

The components, steps, features, objects, benefits and advantages that have been discussed are merely illustrative. None of them, or the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently. In short, the scope of protection is limited solely by the claims that now follow. That scope is intended to be as broad as is reasonably consistent with the language that is used in the claims and to encompass all structural and functional equivalents.

The phrase "means for" when used in a claim embraces the corresponding structure and materials that have been described and their equivalents. Similarly, the phrase "step for" when used in a claim embraces the corresponding acts that have been described and their equivalents. The absence of these phrases means that the claim is not limited to any corresponding structures, materials, or acts.

Nothing that has been stated or illustrated is intended to cause a dedication of any component, step, feature, object, benefit, advantage, or equivalent to the public, regardless of whether it is recited in the claims.

What is claimed is:

1. A method for generating a sawtooth oscillating signal having controlled endpoints, comprising the steps of:
   providing a constant first reference voltage to establish one of the endpoints of the sawtooth oscillating signal;
   applying charge to a first capacitor;
   producing a trigger signal in accordance with comparison of the voltage of the first capacitor with the first reference voltage;
   sharing charge accumulated in the first capacitor with a second capacitor in response to the trigger signal, the shared charge between the first and second capacitors establishing another endpoint of the sawtooth oscillating signal to be generated; and
   successively repeating the preceding steps to vary the voltage level of the first capacitor so as to output as the sawtooth oscillating signal the voltage of the first capacitor which oscillates between the endpoints.

2. The method as recited in claim 1, wherein the sharing step comprises setting a minimum remaining charge in the first capacitor to provide a second reference voltage, wherein the sawtooth oscillating signal oscillates between the first reference voltage and the second reference voltage.

3. The method as recited in claim 1, further comprising the step of discharging the second capacitor while the first capacitor is charging.

4. A method for generating a sawtooth oscillating signal having controlled endpoints, comprising the steps of:
   applying charge to a first capacitor;
   receiving an external trigger signal establishing one of the endpoints of the sawtooth oscillating signal;
   sharing charge accumulated in the first capacitor with a second capacitor in response to the external trigger signal, the shared charge between the first and second capacitors establishing another endpoint of the sawtooth oscillating signal to be generated; and
   successively repeating the preceding steps to vary the voltage level of the first capacitor so as to output as the sawtooth oscillating signal the voltage of the first capacitor which oscillates between the endpoints, wherein
   the trigger signal has a prescribed repetition rate corresponding to a frequency of the sawtooth oscillating signal to be generated and a prescribed width corresponding to the charge-sharing interval of the first and second capacitors.

5. The method as recited in claim 4, in which the sawtooth oscillating signal is applied to a charge current servo to cause the signal to ride on a prescribed baseline.

6. A controlled endpoint sawtooth signal generator circuit, comprising:
   signal generating circuitry configured for generating a sawtooth oscillating signal, the signal generating circuitry comprising first and second charge storage devices, the voltage of the first charge storage device oscillating between endpoints and being outputted as the sawtooth oscillating signal;
   a source of charging current for charging the first charge storage device; and
   a comparator configured for comparing the voltage of the first charge storage device with a constant first reference voltage establishing one of the endpoints of the sawtooth signal, wherein
   the charge storage devices and source of charging current being interconnected to operate, in accordance with the comparison by the comparator, in a first circuit state in which the first charge storage device is charged by the source of charging current and the first and second charge storage devices are mutually disconnected, and in a second circuit state in which the first and second charge storage devices are interconnected for sharing of charge, the shared charge establishing another endpoint of the sawtooth oscillating signal to be generated by the signal generator circuit.

7. The circuit as recited in claim 6, including an output at the first charge storage device for outputting the sawtooth oscillating signal.

8. The circuit as recited in claim 7, including a charge current servo circuit at the sawtooth output.

9. The circuit as recited in claim 8, wherein the charge current servo circuit is configured to servo the sawtooth signal based on the average voltage generated at the output.

10. A controlled endpoint sawtooth signal generator circuit, comprising:

first and second charge storage devices;
a source of charging current; and
a reference source for charging the second charge storage device to a first prescribed voltage, wherein
the charge storage devices and source of charging current are interconnected to operate in a first circuit state in which the first charge storage device is charged by the source of charging current and the first and second charge storage devices are mutually disconnected, and in a second circuit state in which the first and second charge storage devices are interconnected for sharing of charge, the shared charge establishing one of endpoints of a sawtooth signal to be generated by the signal generator circuit.

11. The circuit as recited in claim 10, including a first controlled switch coupled between the first and second charge storage devices, and a second controlled switch coupled between the reference source and second charge storage device, and wherein the controlled switches are controlled to operate in mutually exclusive switching states.

12. The circuit as recited in claim 11, wherein the charge storage devices are capacitors.

13. The circuit as recited in claim 11, wherein the controlled switches are operated in response to a second prescribed voltage on the first charge storage device.

14. The circuit as recited in claim 13, including a comparator for establishing the second prescribed voltage on the first charge storage device.

15. The circuit as recited in claim 14, including a time delay element coupled between the comparator output and the first and second controlled switches.

16. The circuit as recited in claim 11, wherein the controlled switches are operated in response to a trigger signal.

17. The circuit as recited in claim 16, wherein the trigger signal is produced externally with respect to the circuit.

18. The circuit as recited in claim 16, wherein the trigger signal is produced internally with respect to the circuit.

19. A controlled endpoint sawtooth oscillator, comprising:
signal generating circuitry configured for generating a sawtooth oscillating signal, the signal generating circuitry comprising a first charge storage device to which a charging source is coupled, and a second charge storage device coupled to the first charge storage device through a first controlled switch and to a source of a first reference voltage through a second controlled switch, the voltage of the first charge storage device being outputted as the sawtooth oscillating signal; and
a comparator having a first input coupled to the first charge storage device, and a second input coupled to a source of a second reference voltage which is a constant voltage, and an output, the output of the comparator being coupled to control inputs of the first and second controlled switches, wherein
the first and second controlled switches are responsive to a control signal for mutually exclusive operation thereof for sharing charge accumulated in the first charge storage with the second charge storage, the shared charge establishing one of endpoints of the sawtooth oscillating signal a sawtooth signal to be generated by the signal generating circuitry.

20. The sawtooth oscillator as recited in claim 19, wherein the second reference voltage is lower in voltage than the first reference voltage, the first and second reference voltages controlling the shared charge to establish one of the endpoints of the sawtooth signal, and the first reference voltage establishing the other endpoint, and further comprising an impedance coupled between the second storage device and the second controlled switch.

21. The sawtooth oscillator as recited in claim 19, including a time delay element coupled between the comparator output and the first and second controlled switches.

22. A controlled endpoint sawtooth signal generator circuit, comprising:
first and second charge storage devices;
a source of charging current;
a signal generating circuit configured for generating a trigger signal establishing one of endpoints of the sawtooth oscillating signal, wherein
the charge storage devices and source of charging current is interconnected to operate, in accordance with the trigger signal, in a first circuit state in which the first charge storage device is charged by the source of charging current and the first and second charge storage devices are mutually disconnected, and in a second circuit state in which the first and second charge storage devices are interconnected for sharing of charge, wherein
the trigger signal has a prescribed repetition rate corresponding to a frequency of the sawtooth oscillating signal to be generated and a prescribed width corresponding to the charge-sharing interval of the first and second capacitors.

23. A controlled endpoint sawtooth oscillator, comprising:
signal generating circuitry configured for generating a sawtooth oscillating signal, the signal generating circuitry comprising a first charge storage device to which a charging source coupled, and a second charge storage device coupled to the first charge storage device through a first controlled switch and to a source of first reference voltage through a second controlled switch, the voltage of the first charge storage device oscillating between endpoints and being outputted as the sawtooth oscillating signal;
a source of charging current for charging the first charge storage device; and
a comparator configured for comparing the voltage of the first charge storage device with a constant first reference voltage establishing one of the endpoints of the sawtooth signal, wherein
the first and second controlled switches being responsive to the comparison by the comparator for mutually exclusive operation thereof.

* * * * *